(12) United States Patent
Gilton

(10) Patent No.: US 7,564,731 B2
(45) Date of Patent: *Jul. 21, 2009

(54) SOFTWARE REFRESHED MEMORY DEVICE AND METHOD

(75) Inventor: Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

This patent is subject to a terminal disclaimer.

(21) Appl. No.: 11/806,216

(22) Filed: May 30, 2007

(65) Prior Publication Data

US 2007/0258308 A1    Nov. 8, 2007

Related U.S. Application Data

(60) Division of application No. 11/287,488, filed on Nov. 28, 2005, now Pat. No. 7,307,908, which is a continuation of application No. 10/234,001, filed on Aug. 29, 2002, now Pat. No. 7,010,644.

(51) Int. Cl.
  *G11C 7/00* (2006.01)
  *G11C 27/00* (2006.01)
  *G11C 11/00* (2006.01)

(52) U.S. Cl. .................. 365/222; 365/46; 365/148; 365/163

(58) Field of Classification Search .......... 356/46, 356/148, 158, 163, 222
See application file for complete search history.

(56) References Cited

U.S. PATENT DOCUMENTS 3,271,591 A    9/1966    Ovshinsky (Continued)

FOREIGN PATENT DOCUMENTS

EP    0 156 722 A1    10/1985

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—Ly D Pham
(74) *Attorney, Agent, or Firm*—Dickstein Shapiro LLP

(57) ABSTRACT

A software refreshed memory device comprises a plurality of memory cells that must be periodically refreshed to avoid losing data. Preferably, the memory cells can avoid losing data even though the time interval between successive memory refresh operations is relatively long, as compared to the time interval between successive memory refresh operations in a conventional volatile memory device, such as a DRAM. A processor can perform periodic memory refresh operations by executing a set of memory refresh instructions implemented in software, rather than in hardware. Accordingly, the memory device can advantageously be simplified, because the need for memory refresh circuitry and for a unique refresh control signal are advantageously eliminated. Moreover, the processor executing the memory refresh instructions can typically perform more sophisticated algorithms, as compared to memory refresh circuitry implemented in hardware, for determining when to perform a memory refresh operation. For example, the processor can determine whether each individual memory cell needs to be refreshed, thereby advantageously avoiding performing unnecessary refresh operations on memory cells that do not need to be refreshed.

8 Claims, 5 Drawing Sheets

U.S. PATENT DOCUMENTS

| | | | |
|---|---|---|---|
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,317,169 A | 2/1982 | Panepinto, Jr. et al. | |
| 4,459,660 A | 7/1984 | Bellay et al. | |
| 4,597,162 A | 7/1986 | Johnson et al. | |
| 4,608,296 A | 8/1986 | Keem et al. | |
| 4,625,296 A | 11/1986 | Shriver | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,670,860 A | 6/1987 | Wilson | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,148,546 A | 9/1992 | Blodgett | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,296,716 A | 3/1994 | Ovshinsky et al. | |
| 5,335,219 A | 8/1994 | Ovshinsky et al. | |
| 5,341,328 A | 8/1994 | Ovshinsky et al. | |
| 5,345,574 A | 9/1994 | Sakurada et al. | |
| 5,359,205 A | 10/1994 | Ovshinsky | |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,549,762 A | 8/1996 | Cantarini | |
| 5,574,684 A | 11/1996 | Tomoeda | |
| 5,576,239 A | 11/1996 | Hatano et al. | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,851,882 A | 12/1998 | Harshfield | |
| 5,869,843 A | 2/1999 | Harshfield | |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,933,365 A | 8/1999 | Klersy et al. | |
| 6,011,757 A | 1/2000 | Ovshinsky | |
| 6,031,287 A | 2/2000 | Harshfield | |
| 6,084,796 A | 7/2000 | Kozicki et al. | |
| 6,087,674 A | 7/2000 | Ovshinsky et al. | |
| 6,141,241 A | 10/2000 | Ovshinsky et al. | |
| 6,166,959 A | 12/2000 | Gupta et al. | |
| RE37,259 E | 7/2001 | Ovshinsky | |
| 6,339,544 B1 | 1/2002 | Chiang et al. | |
| 6,348,365 B1 | 2/2002 | Moore et al. | |
| 6,388,324 B2 | 5/2002 | Kozicki et al. | |
| 6,404,665 B1 | 6/2002 | Lowrey et al. | |
| 6,418,049 B1 | 7/2002 | Kozicki et al. | |
| 6,420,725 B1 | 7/2002 | Harshfield | |
| 6,429,064 B1 | 8/2002 | Wicker | |
| 6,437,383 B1 | 8/2002 | Xu | |
| 6,440,837 B1 | 8/2002 | Harshfield | |
| 6,462,984 B1 | 10/2002 | Xu et al. | |
| 6,473,332 B1 | 10/2002 | Ignatiev et al. | |
| 6,480,438 B1 | 11/2002 | Park | |
| 6,487,113 B1 | 11/2002 | Park et al. | |
| 6,501,111 B1 | 12/2002 | Lowrey | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,563,164 B2 | 5/2003 | Lowery et al. | |
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowery | |
| 6,576,921 B2 | 6/2003 | Lowery | |
| 6,586,761 B2 | 7/2003 | Lowery | |
| 6,589,714 B2 | 7/2003 | Maimon et al. | |
| 6,590,807 B2 | 7/2003 | Lowery | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,635,914 B2 | 10/2003 | Kozicki et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |
| 6,671,710 B2 | 12/2003 | Ovshinsky et al. | |
| 6,673,700 B2 | 1/2004 | Dennison et al. | |
| 6,674,115 B2 | 1/2004 | Hudgens et al. | |
| 6,687,153 B2 | 2/2004 | Lowery | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,707,712 B2 | 3/2004 | Lowery | |
| 6,714,954 B2 | 3/2004 | Ovshinsky et al. | |
| 6,731,528 B2* | 5/2004 | Hush et al. | 365/100 |
| 7,002,833 B2* | 2/2006 | Hush et al. | 365/100 |
| 7,010,644 B2* | 3/2006 | Gilton | 711/106 |
| 2002/0000666 A1 | 1/2002 | Kozicki et al. | |
| 2002/0123169 A1 | 9/2002 | Moore et al. | |
| 2002/0123248 A1 | 9/2002 | Moore et al. | |
| 2002/0132417 A1 | 9/2002 | Li | |
| 2002/0160551 A1 | 10/2002 | Harshfield | |
| 2002/0168852 A1 | 11/2002 | Harshfield et al. | |
| 2002/0190289 A1 | 12/2002 | Harshfield et al. | |
| 2003/0032254 A1 | 2/2003 | Gilton | |
| 2003/0038301 A1 | 2/2003 | Moore | |
| 2003/0043631 A1 | 3/2003 | Gilton et al. | |

| | | | |
|---|---|---|---|
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0068861 A1 | 4/2003 | Li et al. | |
| 2003/0068862 A1 | 4/2003 | Li et al. | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0156447 A1 | 8/2003 | Kozicki | |
| 2003/0156463 A1 | 8/2003 | Casper et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

FOREIGN PATENT DOCUMENTS

| | | |
|---|---|---|
| JP | 4-53086 | 2/1992 |
| JP | 9-320289 | 12/1997 |
| JP | 2000-512058 | 9/2000 |
| WO | WO 97/48032 | 12/1997 |
| WO | WO 99/28914 | 6/1999 |
| WO | WO 00/48196 | 8/2000 |
| WO | WO 01/86400 A1 | 11/2001 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A., Electrical & thermal conductivity of the amorphous semiconductor $GexSe1-x$, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Bernede, J.C.; Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near $x=\frac{1}{3}$ in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thrope and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broke chemical order in a GeSe2 glass, Phys. Rev. B 25 (1982) 2975-2978.

Boolchand, P.; Grothaus, J.; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) $17^{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L., Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X.; Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1980) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan, J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Hirose, Y.; Hirose, H., Polarity-dependent memory switching and behavior of Ag dendrite in Ag-photodoped amorphous As2S3 films, J. Appl. Phys. 47 (1976) 2767-2772.

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3)1-x (0<=x<=0.571) glasses, Solid state Ionics, 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185-C2-188.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang,Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M.; Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., the contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B.; Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon,A.G, Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant, S.;Peytavin,S.;Ribes,M.;Flank,A.M.;Dexpert,H.;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; ParvanovS.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

Michael N. Kozicki, *1. Programmable Metallization Cell Technology Description*, Feb. 18, 2000.

Michael N. Kozicki, Axon Technologies Corp. and Arizona State University, Presentation to Micron Technology, Inc., Apr. 6, 2000.

Yoji Kawamoto et al., "Ionic Conduction in $As_2S_3$-$Ag_2S$, $GeS_2$-$GeS$-$Ag_2S$ and $P_2S_5$-$Ag_2S$ Glasses," Journal of Non-Crystalline Solids 20 (1976), pp. 393-404.

Patent Abstracts of Japan, vol. 1998, No. 4, Mar. 31, 1998 and JP 9 312094 A, Dec. 2, 1997.

\* cited by examiner

SOFTWARE REFRESHED MEMORY DEVICE AND METHOD

CROSS REFERENCE TO RELATED APPLICATIONS

The present application is a divisional of U.S. application Ser. No. 11/287,488, now U.S. Pat. No. 7,307,908, filed on Nov. 28, 2005, which in turn is a continuation of U.S. application Ser. No. 10/234,001, now U.S. Pat. No. 7,010,644, filed on Aug. 29, 2002, the disclosures of which are herewith incorporated by reference in their entirety.

BACKGROUND OF THE INVENTION

1. Field of the Invention

This invention relates generally to computer memory devices and more particularly to memory devices that must be periodically refreshed to avoid losing data.

2. Description of the Related Art

Certain memory devices can maintain the information stored in the memory indefinitely, even when the power to the memory device is turned off. These memory devices are known as non-volatile memory devices. Some examples of non-volatile memory devices include magnetic random access memories (MRAMs), erasable programmable read only memories (EPROMs), and variations thereof.

Other memory devices require power to maintain the information stored in the memory. These memory devices, which are known as volatile memory devices, must be periodically refreshed to avoid losing data. One common example of a volatile memory device is a dynamic random access memory (DRAM), wherein voltages stored in capacitors represent digital bits of information. Because the voltage stored in a capacitor dissipates over time, the capacitors of a DRAM must be periodically re-charged to maintain the information stored in the DRAM.

Conventional volatile memory devices include a plurality of individual memory cells configured in an array, which typically comprises a configuration of intersecting rows and columns. To maintain the information stored in a conventional volatile memory device, each memory cell in the array is typically refreshed at least several times per second. For example, in some conventional DRAMs, each memory cell must be refreshed about once every 64 milliseconds to avoid losing the information stored in the DRAM. Accordingly, conventional volatile memory devices typically include refresh circuitry to ensure that every memory cell is refreshed at least as often as necessary to avoid losing data, which is commonly at least several times per second.

SUMMARY OF THE INVENTION

In one embodiment, a method of refreshing a cell in a memory device comprises determining whether said cell is in a written state or in an erased state, and, if said cell is in said written state, refreshing said cell by issuing a refresh write instruction to said cell.

In another embodiment, a method of preserving data stored in a volatile memory device having a plurality of cells comprises, for each of said plurality of cells, determining whether said cell needs to be refreshed, and, if said cell needs to be refreshed, refreshing said cell.

In another embodiment, a method of preserving data stored in a volatile memory device having a plurality of cells comprises refreshing said plurality of cells, and waiting for a predetermined period of time lasting for at least about one second, wherein none of said plurality of cells is refreshed during said predetermined period of time.

In another embodiment, a method of preserving data stored in a volatile memory device having a plurality of memory cells comprises addressing a first memory cell, waiting for a first period of time since said first memory cell was addressed, and determining whether said first memory cell needs to be refreshed. If said first memory cell needs to be refreshed, the method further comprises determining whether system resources are available to refresh said first memory cell, and, if said first memory cell needs to be refreshed and if said system resources are not available, monitoring whether said system resources become available to refresh said first memory cell within a second period of time since said first memory cell was addressed. If said first memory cell needs to be refreshed and if said system resources do not become available within said second period of time, the method further comprises forcing said resources to be relinquished, such that said resources become available to refresh said first memory cell, and, if said first memory cell needs to be refreshed, refreshing said first memory cell using said available system resources. The method further comprises addressing a second memory cell.

In another embodiment, a method of avoiding loss of data in a volatile memory device comprises establishing a deadline by which said volatile memory device must be refreshed, and monitoring whether resources are available to refresh said volatile memory device. If resources do not become available to refresh said volatile memory device within a first predetermined time period before said deadline, the method further comprises forcing said resources to be relinquished, such that said resources become available to refresh said volatile memory device. The method further comprises using said available resources to refresh said volatile memory device before said deadline.

In another embodiment, a computer system comprises a processor, a memory device coupled to said processor, wherein said memory device comprises a plurality of cells that must be periodically refreshed, and a software module that, when executed by said processor, refreshes said plurality of cells.

In another embodiment, a memory device comprises a plurality of cells that must be periodically refreshed, wherein said plurality of cells are configured to be refreshed in response to a write instruction or an erase instruction received from a processor, and wherein said memory device is not configured to generate or to receive a refresh control signal that differs from said write instruction or from said erase instruction.

In another embodiment, a memory device comprises a plurality of cells that must be periodically refreshed, wherein said plurality of cells are configured to be refreshed in response to a write instruction or an erase instruction received from a processor, and wherein said memory device is not configured to generate or to receive a refresh control signal that differs from said write instruction or from said erase instruction. Each of said plurality of cells comprises a programmable metallization cell, which comprises a cell body having a top surface, wherein said cell body comprises a chalcogenide-metal ion glass and two electrodes disposed at said top surface, wherein said electrodes are spaced a distance apart from one another.

In another embodiment, a memory device comprises a plurality of cells that must be periodically refreshed, wherein said plurality of cells are configured to be refreshed in response to a write instruction or an erase instruction received from a processor.

DETAILED DESCRIPTION

Figure 1:
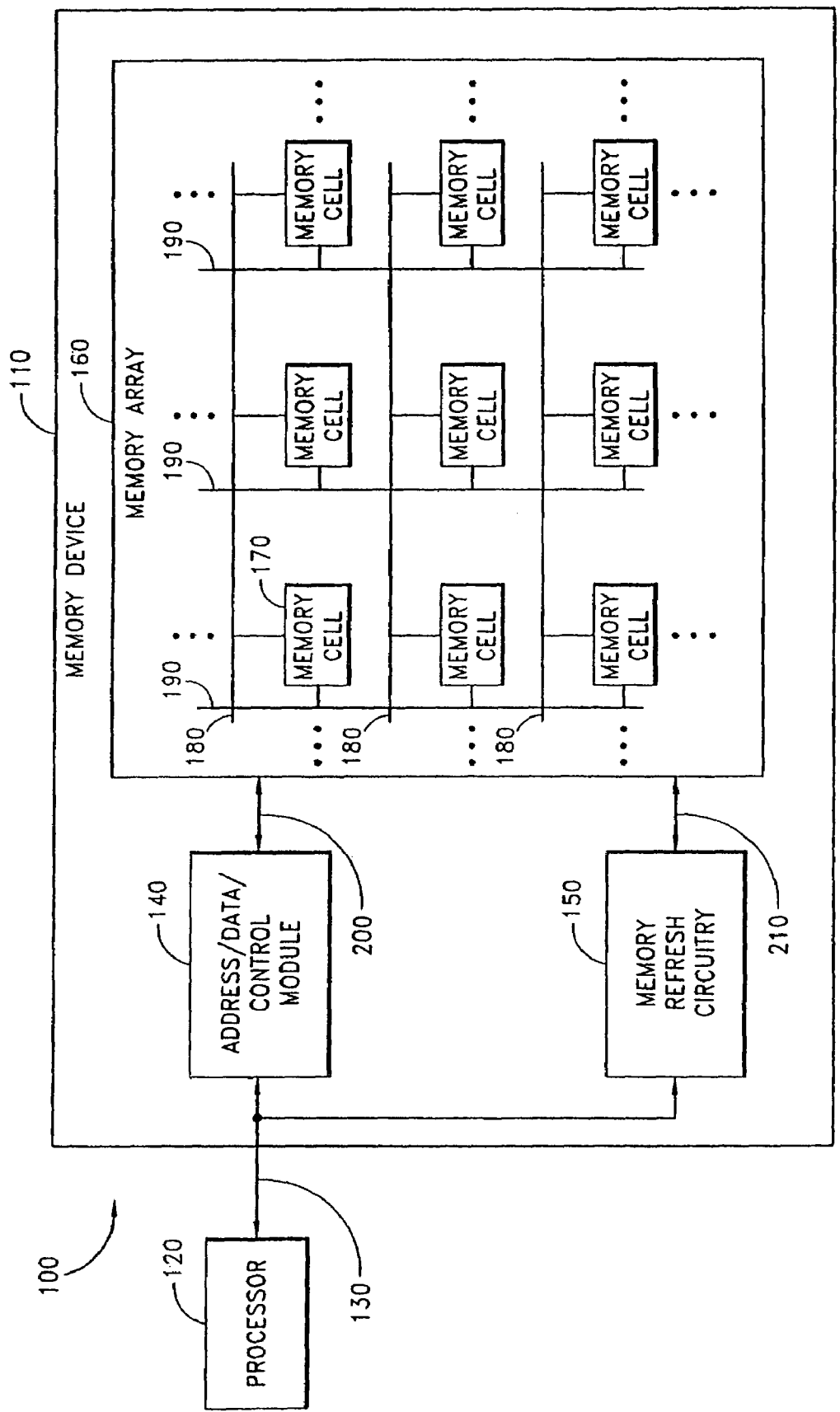
FIG. 1 illustrates a computer system that includes a volatile memory device.

FIG. 1 illustrates a computer system 100 that includes a conventional volatile memory device 110. The computer system 100 also comprises a processor 120 coupled to the memory device 110 via a bus 130. The memory device 110 comprises an address/data/control module 140 and memory refresh circuitry 150, both of which are coupled to the processor 120 via the bus 130. The memory device 110 also comprises a memory array 160 coupled to the address/data/control module 140 via line 200 and to the memory refresh circuitry 150 via line 210. Those of ordinary skill in the art will understand that lines 200 and 210 may be implemented in the memory device 110 as part of a single physical bus. The memory array 160 comprises a plurality of memory cells 170, which are interconnected by a plurality of intersecting rows 180 and columns 190.

To perform operations in the memory device 110, the processor 120 transmits certain signals to the memory device 110 via the bus 130. For example, to read data stored at a particular memory address, the processor 120 issues a read command, together with the memory address, to the bus 130. The address/data/control module 140 receives and processes the read command by accessing the memory array 160 via line 200. Specifically, the address/data/control module 140 generates a read control signal on line 200 and addresses the desired memory cell 170 by activating the appropriate row 180 and column 190. The address/data/control module 140 then receives the data stored at the addressed memory cell 170 via line 200, and passes the data to the processor 120 via the bus 130.

In addition, to write data to a particular memory address, the processor 120 issues a write command, together with the memory address and the data to be stored, to the bus 130. The address/data/control module 140 receives and processes the write command by generating a write control signal on line 200 and addressing the desired memory cell 170, as described above. The address/data/control module 140 then passes the data to be stored to the addressed memory cell 170 via line 200.

Because the data stored in the memory cells 170 dissipates over time, the memory cells 170 must be periodically refreshed to avoid losing the data stored in the memory device 110. The primary function of the memory refresh circuitry 150 is to perform these periodic memory refresh operations. When the memory refresh circuitry 150 determines that it is necessary to perform a memory refresh operation, the memory device 110 is made unavailable to the processor 120 to perform other operations, such as a read operation or a write operation.

To perform a memory refresh operation, the memory refresh circuitry 150 typically sequentially addresses the rows 180 of the memory array 160. When a given row 180 of the array 160 is addressed, the memory refresh circuitry generates a refresh control signal on line 210, which causes all of the memory cells 170 in the addressed row 180 to be refreshed simultaneously. By refreshing a large number of memory cells 170 simultaneously, the memory refresh circuitry 150 advantageously reduces the amount of time required to perform a memory refresh operation, thereby reducing the amount of time that the memory device 110 is unavailable to the processor 120 to perform other operations.

Because the memory device 110 is unavailable to perform other operations during a memory refresh operation, it is desirable to time memory refresh operations such that they occur at times when they will not conflict with requests from the processor 120. Therefore, the memory refresh circuitry 150 is often configured to identify time periods when the processor 120 is not likely to issue requests to the memory device 110, and to perform memory refresh operations during these identified time periods. On the other hand, because power is required to perform a memory refresh operation, it is desirable to minimize the number of memory refresh operations performed. Thus, the memory refresh circuitry 150 is also often configured to perform memory refresh operations as infrequently as possible, while preserving the data stored in the memory device 110.

Nevertheless, to avoid losing data stored in conventional volatile memory devices 110, the memory refresh circuitry 150 must perform memory refresh operations frequently, often many times per second. For example, in some embodiments, each memory cell 170 must be refreshed at least about once every 64 milliseconds to avoid losing data. In these embodiments, to avoid losing the information stored in the memory device 110, the memory refresh circuitry 150 must ensure that every memory cell 170 is refreshed at least more often than about 15 times per second.

Figure 2:
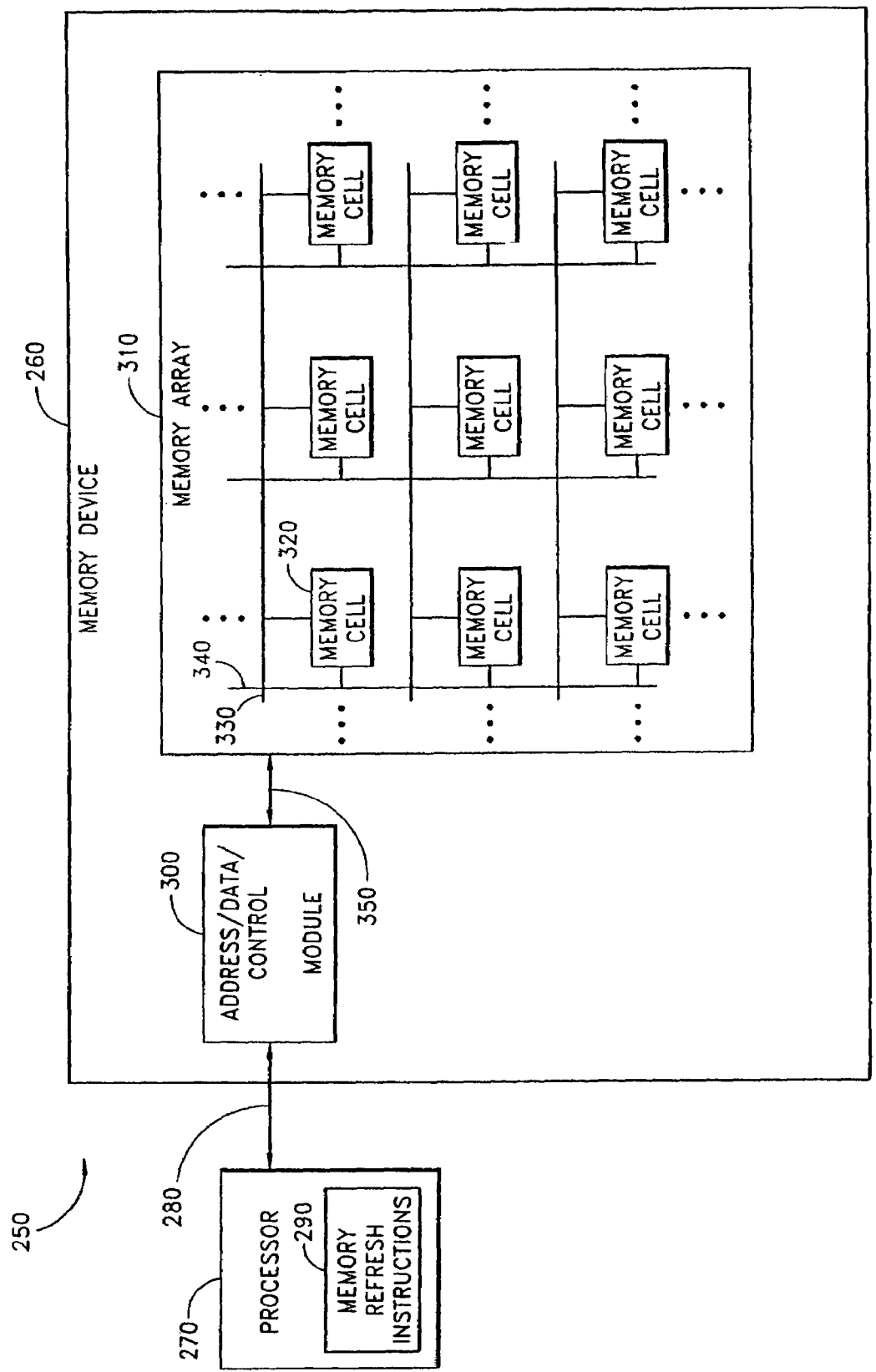
FIG. 2 illustrates a computer system having a software refreshed memory device in accordance with one embodiment of the present invention.

FIG. 2 illustrates a computer system 250 having a software refreshed memory device 260 in accordance with one embodiment of the present invention. The computer system 250 also comprises a processor 270 coupled to the memory device 260 via a bus 280. The computer system 250 further comprises a set of memory refresh instructions 290, which are implemented in software that can be executed by the processor 270. The memory device 260 comprises an address/data/control module 300 which is coupled to the processor 270 via the bus 280. The memory device 260 also comprises a memory array 310 coupled to the address/data/control module 300 via line 350. The memory array 310 comprises a plurality of memory cells 320, which are interconnected by a plurality of intersecting rows 330 and columns 340.

The computer system 250 illustrated in FIG. 2 can perform memory read and write operations using the same methods described above in connection with FIG. 1. In addition to these methods, however, the computer system 250 can perform memory read and write operations in a variety of other ways that are well-known to those of ordinary skill in the art.

In some embodiments, the memory cells 320 of the software refreshed memory device 260 comprise volatile memory cells, which are preferably more stable than conventional DRAM memory cells. For example, in one embodiment, the memory cells 320 can avoid losing data even though the time interval between successive memory refresh operations is about 0.1 seconds. In another embodiment, the time interval between successive memory refresh operations can be about one second. In yet another embodiment, the time interval between successive memory refresh operations can be about one hour. In yet another embodiment, the time interval between successive memory refresh operations can be about one day to one week.

In some embodiments, the memory cells 320 of the software refreshed memory device 260 comprise programmable conductor random access memory (PCRAM) cells, which are described in U.S. Pat. Nos. 5,761,115, 5,896,312, 5,914,893, 6,084,796 to Kozicki et al. ("the Kozicki patents"), in U.S. Pat. No. 6,348,365 to Moore et al. ("the Moore patent"), and in the following co-pending U.S. patent applications: Ser. No. 10/121,792 entitled "Method of Manufacture of Programmable Conductor Memory" filed Apr. 10, 2002, U.S. Ser. No. 10/121,790 entitled "Programmable Conductor Memory Cell Structure and Method Therefor" filed Apr. 10, 2002, and Ser. No. 10/121,794 entitled "Thin Film Diode Integrated with Chalcogenide Memory Cell" filed Apr. 10, 2002. The Kozicki patents, the Moore patent, and these co-pending patent applications are hereby incorporated in their entireties by this reference. As discussed in more detail in these references, a PCRAM cell comprises a pair of electrodes and can exist in one of two possible states. In the first state, an electrical short exists between the electrodes of the PCRAM cell. In the second state, an open circuit exists between the electrodes of the PCRAM cell.

Some embodiments of a PCRAM cell comprise a glass ion conductor, such as a chalcogenide-metal ion glass, and two electrodes disposed at the surface of the glass ion conductor and spaced a distance apart from one another. In one embodiment, a PCRAM cell comprises germanium selenide with a Group IV metal (e.g., silver) dissolved therein, such as $Ag/Ge_3Se_7$. Preferably, one of the electrodes comprises a Group IV metal, and the glass element of the PCRAM cell contains the same metal.

In operation, when a voltage having a first polarity is applied across the electrodes of a PCRAM cell, a conductive path is created between the electrodes along the sidewalls of the via in which the glass element is formed. When a voltage having the opposite polarity is applied across the electrodes, the metal ions re-dissolve into the cell body, thereby causing the conductive path to disappear. The presence or absence of a conductive path within a PCRAM cell can be detected by measuring the electrical resistance between the electrodes. When a conductive path is present, an electrical short exists between the electrodes, and the resistance between the electrodes is low (e.g., on the order of milliohms). On the other hand, when no conductive path is present, an open circuit exists between the electrodes, and the resistance between the electrodes is high (e.g., on the order of megaoluns).

The features of FIG. 2 are referenced throughout the discussion below of operation processes.

Typically, the memory cells 320 of the memory device 260 are capable of existing in one of two states, i.e., a "written" state or an "erased" state. For example, if a memory cell 320 comprises a capacitor capable of holding a charge, the presence of a charge in the capacitor would correspond to the written state, and the absence of a charge in the capacitor would correspond to the erased state. Similarly, if a PCRAM cell acts as a memory cell 320, the presence of a conductive path between the electrodes would correspond to the written state, while the absence of a conductive path between the electrodes would correspond to the erased state. Those of ordinary skill in the art will understand that, in general, the presence of an element of interest within a memory cell 320 will correspond to the written state, whereas the absence of an element of interest will correspond to the erased state.

As discussed above in connection with FIG. 1, when a memory cell 170 of a conventional volatile memory device 110 is placed in a particular state, the memory cell 170 remains in the given state for a relatively short period of time, such as, for example, about 64 milliseconds. Because such conventional memory cells 170 retain their assigned states for such a short time period, each memory cell 170 must be refreshed often, such as, for example, at least more often than about 15 times per second.

By contrast, when a memory cell 320 of the software refreshed memory device 260 illustrated in FIG. 2 is placed in a particular state, the memory cell 320 advantageously remains in the given state for a relatively long period of time. For example, in some embodiments, each memory cell 320 can maintain a given state for a period of seconds, minutes, hours, days, weeks, or longer. Accordingly, the data stored in the memory device 260 can be preserved while performing memory refresh operations less frequently, such as, for example, about once every few weeks, rather than several times per second.

Because memory refresh operations can occur less frequently, the computer system 250 can advantageously perform these memory refresh operations by executing a set of memory refresh instructions 290 implemented in software, rather than in hardware. For example, in some embodiments, the memory refresh instructions 290 constitute part of the operating system of the computer system 250.

By implementing the memory refresh instructions 290 in software, rather than in hardware, the memory device 260 can advantageously be simplified. For example, the need for the memory refresh circuitry 150 and for a unique refresh control signal on line 210, as illustrated in FIG. 1, are advantageously eliminated. Another advantage of implementing the memory refresh instructions 290 in software, rather than in hardware, is that the processor 270 (FIG. 2) can perform more sophisticated algorithms, as compared to the memory refresh circuitry 150 (FIG. 1), for determining when to perform a memory refresh operation.

Figure 3:
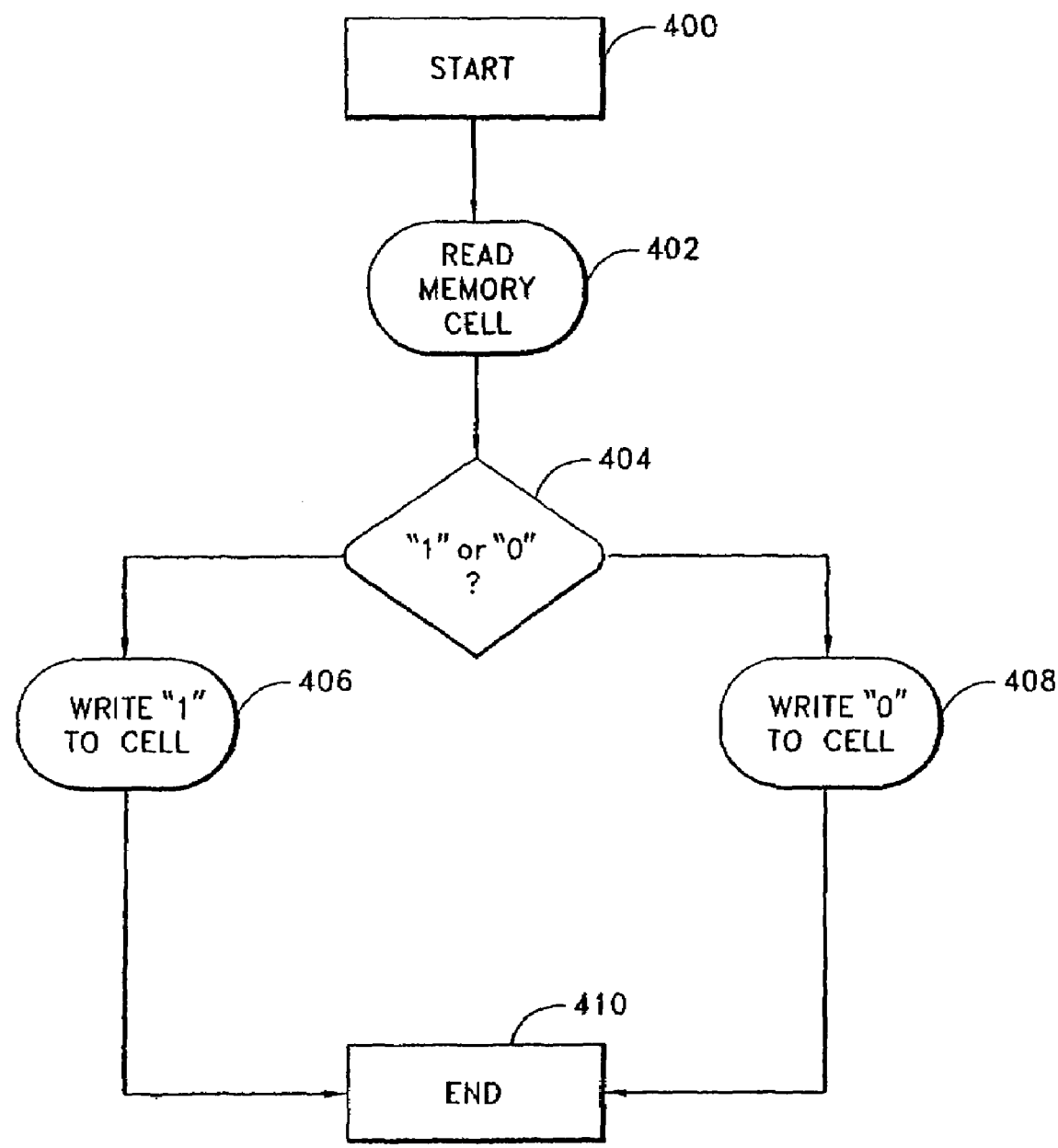
FIG. 3 illustrates a method of refreshing a memory cell in accordance with one embodiment of the present invention.

FIG. 3 illustrates a method of refreshing a memory cell 320 (FIG. 2) in accordance with one embodiment of the present invention. In a first step 400, the process begins. In a next step 402, the processor 270 reads the state of the memory cell 320. The state of the memory cell 320 is assigned a logical value, which corresponds to a digital bit of data. For example, in some embodiments, the written state of a memory cell 320 may correspond to a logical "1", while the erased state of the memory cell 320 corresponds to a logical "0". In some alternative embodiments, on the other hand, the written state of a memory cell 320 may correspond to a logical "0", while the erased state of the memory cell 320 corresponds to a logical "1".

In a step 404, the processor 270 determines whether the data bit stored in the memory cell 320 is a "1" or a "0". If the data bit is a "1", then, in a step 406, the processor 270 writes a "1" to the memory cell 320. For example, if a "1" corresponds to the written state, then, during step 406, the processor 270 issues a "write instruction" to the memory cell, i.e., a write command is issued, and the memory cell 320 is placed in the written state. If, during step 404, the processor 270 determines that the data bit stored in the memory cell 320 is a "0", then, in a step 408, the processor 270 writes a "0" to the memory cell 320. For example, if a "0" corresponds to the erased state, then, during step 408, the processor 270 issues an "erase instruction" to the memory cell, i.e., a write command is issued, and the memory cell 320 is placed in the erased state.

A write instruction issued during a memory refresh operation can be the same as a write instruction issued during a standard write operation to the memory device 260. Similarly, an erase instruction issued during a memory refresh operation can be the same as an erase instruction issued during a standard write operation to the memory device 260. Accordingly, as discussed above, the need for a unique refresh control signal, which is utilized only during memory refresh operations, is advantageously eliminated. After the processor 270 completes step 406 or step 408, then, in a final step 410, the process ends.

In the method illustrated in FIG. 3, it is assumed that a memory cell 320 (FIG. 2) will not remain in the written state or in the erased state indefinitely unless it is periodically refreshed by issuing a write instruction or an erase instruction, whichever is appropriate, to the memory cell 320. In some embodiments, however, the memory cells 320 tend to revert to one particular state over time. For example, in some embodiments, the memory cells 320 tend to revert to the erased state over time. In these embodiments, when a memory cell 320 is placed in the written state, the memory cell 320 will not remain in the written state indefinitely unless it is periodically refreshed by performing a write operation on the memory cell 320. On the other hand, because the natural tendency of the memory cells 320 is to revert to the erased state, a memory cell 320 placed in the erased state will remain in this state indefinitely, without needing to be refreshed. In these embodiments, the method illustrated in FIG. 3 can advantageously be simplified by eliminating either step 406 or step 408, whichever corresponds to the erased state.

Moreover, in the method illustrated in FIG. 3, it is assumed that each memory cell 320 (FIG. 2) is capable of existing in one of only two states. Nevertheless, in light of the present disclosure, those of ordinary skill in the art will understand how the method illustrated in FIG. 3 can be modified if the memory cells 320 are capable of existing in more than two states.

If a memory refresh operation comprises the method illustrated in FIG. 3, then each memory cell 320 (FIG. 2) is refreshed individually; rather than refreshing a large number of memory cells 320 simultaneously, as discussed above in connection with FIG. 1. By evaluating each memory cell 320 individually, the processor 270 can determine whether each individual memory cell 320 needs to be refreshed, thereby advantageously avoiding performing unnecessary refresh operations on memory cells 320 that do not need to be refreshed.

Figure 4:
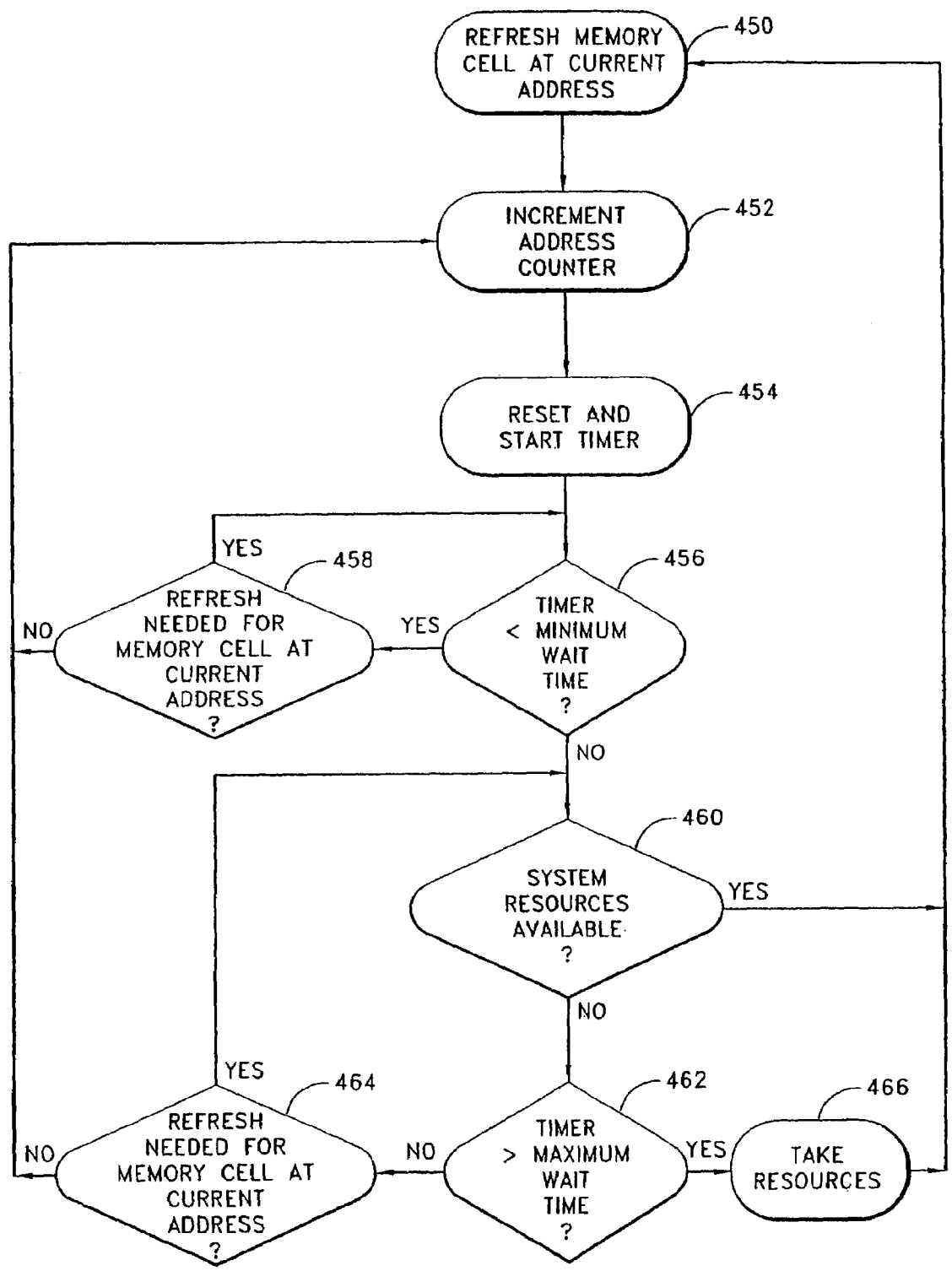
FIG. 4 illustrates a method of refreshing a plurality of memory cells in accordance with one embodiment of the present invention.

FIG. 4 illustrates a method of refreshing a plurality of memory cells 320 (FIG. 2) in accordance with one embodiment of the present invention. To perform this method, the computer system 250 maintains a counter having a value which corresponds to a particular address in the memory array 190. In a first step 450, the memory cell 320 at the address corresponding to the current value of the counter is refreshed, using the method illustrated in FIG. 3 or another suitable method. In a next step 452, the value of the counter is incremented, and in a next step 454, a timer is reset and started.

In a step 456, the processor 270 determines whether the timer has exceeded a predetermined minimum wait time. The appropriate value for the minimum wait time can be determined by considering a number of factors, such as, for example, the maximum time that a memory cell 320 can retain its assigned state, the time required to refresh a memory cell 320, the number of memory cells 320 to be refreshed, and the like. As discussed above, this predetermined minimum wait time can advantageously be a relatively long period of time, such as, for example, a period of seconds, minutes, hours, days, or longer. In one embodiment, the predetermined minimum wait time is a period of about one minute. In another embodiment, the minimum wait time is a period of about one hour. In yet another embodiment, the minimum wait time is a period of about one day to one week.

If the minimum wait time has not yet been reached, then, in a step 458, the processor 270 determines whether the memory cell 320 at the address corresponding to the current value of the counter needs to be refreshed. A number of different conditions may indicate that the memory cell 320 at the current address does not need to be refreshed. For example, as discussed above, in some embodiments, when a memory cell 320 is in the erased state, the memory cell 320 does not need to be refreshed. Moreover, if the processor 270 performs a write operation to the memory cell 320 sometime after the timer is reset and started during step 454, then the memory cell 320 does not need to be refreshed until the next memory refresh cycle.

If, while waiting for the timer to reach the minimum wait time, the processor 270 determines that the memory cell 320 at the current address does not need to be refreshed, then the process returns to step 452, where the value of the counter corresponding to the current memory address is incremented, and the process continues, as described above. On the other hand, if, once the timer reaches the minimum wait time, the memory cell 320 at the current address still needs to be refreshed, then the process proceeds to a step 460, where the processor 270 determines whether system resources are available to refresh the memory cell 320. In making this determination, the processor 270 may evaluate a wide variety of factors, such as, for example, the demands on the processor 270 and on the memory device 260 or other devices in the computer system 250, and the like.

If system resources are available, then the process returns to step 450, where the memory cell 320 at the current address is refreshed, and the process continues, as described above. On the other hand, if system resources are not available to refresh the memory cell 320, then, in a step 462, the processor 270 determines whether the timer has exceeded a predetermined maximum wait time. As with the minimum wait time, the appropriate value for the maximum wait time can be determined by considering a number of factors, such as, for example, the maximum time that a memory cell 320 can retain its assigned state, the time required to refresh a memory cell 320, the number of memory cells 320 to be refreshed, and the like. As discussed above, this predetermined maximum wait time can advantageously be a relatively long period of time, such as, for example, a period of seconds, minutes, hours, days, weeks, or longer. In one embodiment, the maximum wait time is a period of about one hour. In another embodiment, the maximum wait time is a period of about one week. In yet another embodiment, the maximum wait time is a period of about one month.

If the maximum wait time has not yet been reached, then, in a step 464, the processor 270 determines whether the memory cell 320 at the address corresponding to the current value of the counter needs to be refreshed. As discussed above in connection with step 458, a number of different conditions may indicate that the memory cell 320 at the current address does not need to be refreshed.

If the memory cell 320 at the current address does not need to be refreshed, then the process returns to step 452, where the value of the counter corresponding to the current memory address is incremented, and the process continues, as described above. On the other hand, if the memory cell 320 at the current address needs to be refreshed, then the processor 270 continues to monitor whether system resources have become available to refresh the memory cell 320.

Once the timer reaches the predetermined maximum wait time, if system resources have not become available and the memory cell 320 at the current address still needs to be refreshed, then the process proceeds to a step 466, where the processor 270 forces certain system resources to be relinquished by other processes, such that the necessary resources become available to refresh the memory cell 320. The process then returns to step 450, where the memory cell 320 at the current address is refreshed, and the process continues, as described above.

In one embodiment, the process illustrated in FIG. 4 is repeatedly performed, without interruption, by the processor 270. In this embodiment, the memory refresh operation is an ongoing process, which is constantly occurring in the background of other processes being executed by the processor 270. The minimum wait time and the maximum wait time can advantageously be selected and adjusted such that each memory cell 320 is refreshed as infrequently as possible, while preserving the information stored in the memory device 310.

Figure 5:
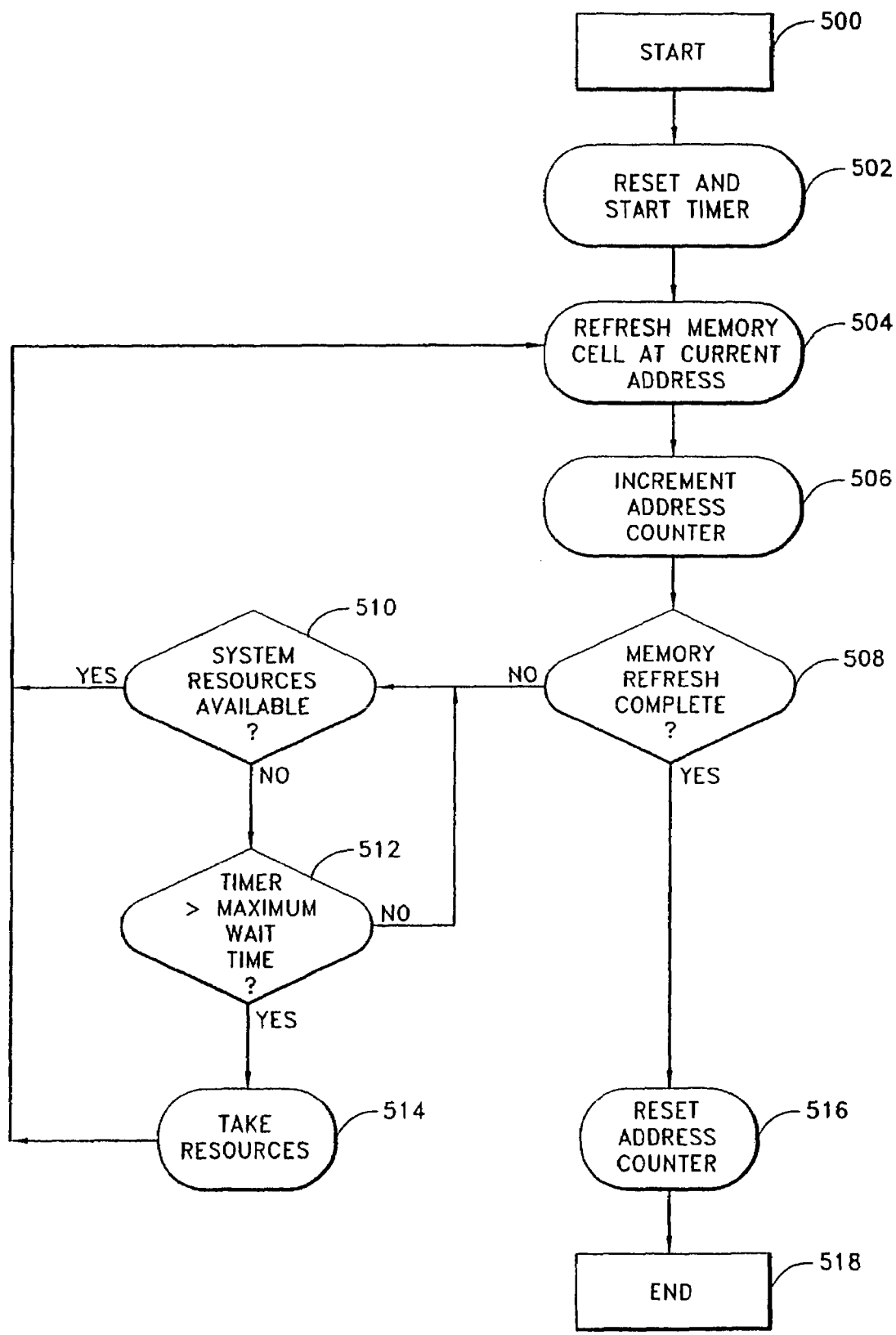
FIG. 5 illustrates a method of refreshing a plurality of memory cells in accordance with one embodiment of the present invention.

FIG. 5 illustrates another method of refreshing a plurality of memory cells 320 in accordance with one embodiment of the present invention. In a first step 500, the process begins, and in a next step 502, a timer is reset and started. As with the method illustrated in FIG. 4, the computer system 250 of FIG. 2 maintains a counter having a value which corresponds to a particular address in the memory array 310 to perform the method illustrated in FIG. 5. In a step 504, the memory cell 320 at the address corresponding to the current value of the counter is refreshed, using the method illustrated in FIG. 3 or another suitable method. In a next step 506, the value of the counter is incremented.

In a step 508, the processor 270 determines whether the memory refresh operation is complete. A number of conditions may indicate that the memory refresh operation is complete. For example, the memory refresh operation may be considered complete when each memory cell 320 in a memory array 310 has been refreshed, or when each memory cell 320 in a particular block of memory has been refreshed.

If the memory refresh operation is not yet complete, then, in a step 510, the processor 270 determines whether system resources are available to refresh the memory cell 320 at the address corresponding to the current value of the counter. If system resources are available, then the process returns to step 504, where the memory cell 320 at the current address is refreshed, and the process continues, as described above.

On the other hand, if system resources are not available to refresh the memory cell 320, then, in a step 512, the processor 270 determines whether the timer has exceeded a predetermined maximum wait time. As discussed above in connection with FIG. 4, the appropriate value for the maximum wait time can be determined by considering a number of factors, such as, for example, the maximum time that a memory cell 320 can retain its assigned state, the time required to refresh a memory cell 320, the number of memory cells 320 to be refreshed, and the like. Moreover, as discussed above, this predetermined maximum wait time can advantageously be a relatively long period of time, such as, for example, a period of seconds, minutes, hours, days, weeks, or longer.

In one embodiment, the maximum wait time discussed above in connection with FIG. 4 corresponds to the maximum time that the processor 270 can wait before it forces system resources to become available to refresh an individual memory cell 320. In the process illustrated in FIG. 5, on the other hand, the maximum wait time corresponds to the maximum time that the processor 270 can wait before it forces system resources to become available to refresh all of the remaining memory cells 320 in the memory array 310 or in the block of memory being refreshed. Thus, in one embodiment, the maximum wait time is a period of about one day. In another embodiment, the maximum wait time is a period of about one week. In yet another embodiment, the maximum wait time is a period of about one month to two months.

If the maximum wait time has not yet been reached, then process returns to step 510, where, as described above, the processor 270 continues to monitor whether system resources have become available to refresh the memory cell 320. Once the timer reaches the predetermined maximum wait time, if system resources have not become available, then the process proceeds to a step 514, where the processor 270 forces certain system resources to be relinquished by other processes, such that the necessary resources become available to refresh the memory cell 320. The process then returns to step 504, where the memory cell 320 at the current address is refreshed, and the process continues, as described above.

This process repeats until, during step 508, the processor 270 determines that the memory refresh operation is complete. Once this determination is made, the process then proceeds to a step 516, where the memory address counter is reset. In a final step 518, the process ends.

In one embodiment, the process illustrated in FIG. 5 is repeated by the processor 270 periodically. In this embodiment, the memory refresh operation is performed periodically, rather than being a constantly ongoing process, as described above in connection with FIG. 4. The processor 270 can advantageously call and perform this process at regular time intervals or at irregular time intervals, depending upon the requirements of the computer system 250 and upon the longevity of the data stored in the memory cells 320.

The processes illustrated in FIGS. 3, 4 and 5 are merely examples of algorithms that can be implemented in the memory refresh instructions 290. Those of ordinary skill in the art will understand that these exemplary algorithms can be easily modified by adding, removing, or varying certain steps. Moreover, in light of the present disclosure, those of ordinary skill in the art will understand how to develop a wide variety of alternative algorithms.

I claim:

1. A method of preserving data stored in a memory element having a plurality of variable resistance memory cells, said method comprising:

addressing a first individual memory cell of said plurality of variable resistance memory cells;

waiting for a first period of time since said first individual memory cell was addressed;

determining whether said first individual memory cell needs to be refreshed;

if said first individual memory cell needs to be refreshed, determining whether system resources are available to refresh said first individual memory cell;

if said first individual memory cell needs to be refreshed and if said system resources are not available, monitoring whether said system resources become available to refresh said first individual memory cell within a second period of time since said first individual memory cell was addressed;

if said first individual memory cell needs to be refreshed and if said system resources do not become available within said second period of time, forcing said resources to be relinquished, such that said resources become available to refresh said first individual memory cell; and if said first individual memory cell needs to be refreshed, refreshing said first individual memory cell using said available system resources.

2. The method of claim 1, wherein said first period of time is within the range of approximately one second to approximately one week.

3. The method of claim 1, wherein said second period of time is within the range of approximately one week to approximately two months.

4. The method of claim 1, wherein said plurality of variable resistance memory cells comprises a plurality of programmable conductor random access memory cells.

5. The method of claim 4, wherein each of said plurality of programmable conductor random access memory cells comprises:
- a cell body having a top surface, wherein said cell body comprises a chalcogenide-metal ion glass; and
- two electrodes disposed at said top surface, wherein said electrodes are spaced a distance apart from one another.

6. The method of claim 5, wherein said chalcogenide-metal ion glass comprises germanium selenide having a Group IV metal dissolved therein.

7. The method of claim 6, wherein said chalcogenide-metal ion glass comprises Ag/Ge3Se7.

8. A memory system comprising:

a processor coupled to a memory device, said memory device having a plurality of variable resistance memory cells that must be periodically refreshed;

wherein said processor is configured to wait for a first period of time after a first individual memory cell is accessed to determine whether said first individual memory cell needs to be refreshed; and to refresh said first individual memory cell after said first period of time, if it is determined that said first individual memory cell needs to be refreshed.

* * * * *